United States Patent [19]

Naganawa et al.

[11] Patent Number: 5,629,100
[45] Date of Patent: May 13, 1997

[54] NON-MAGNETIC SINGLE CRYSTAL MN—ZN FERRITE FOR FLOATING TYPE MAGNETIC HEADS

[75] Inventors: Masato Naganawa; Hiroyasu Tsuji, both of Nagoya, Japan

[73] Assignee: NGK Insulators, Ltd., Japan

[21] Appl. No.: 580,495

[22] Filed: Dec. 29, 1995

Related U.S. Application Data

[63] Continuation of Ser. No. 149,231, Nov. 9, 1993, abandoned.

[30] Foreign Application Priority Data

Nov. 20, 1992 [JP] Japan .................................. 4-311996

[51] Int. Cl.⁶ .......................................................... B32B 9/00
[52] U.S. Cl. .......................... 428/700; 117/7; 117/946; 360/103; 360/110; 428/332; 428/402; 428/694 TR; 428/694 BN; 428/900
[58] Field of Search .................................. 428/700, 332, 428/402, 694 TR, 694 BN, 900; 117/7, 946; 360/103, 110

[56] References Cited

U.S. PATENT DOCUMENTS

| | | | |
|---|---|---|---|
| 4,519,870 | 5/1985 | Matsuzawa et al. | 156/603 |
| 4,878,141 | 10/1989 | Koyama | 360/120 |
| 5,104,483 | 4/1992 | Takeya | 156/647 |

FOREIGN PATENT DOCUMENTS

| | | | |
|---|---|---|---|
| 62-223099 | 10/1987 | Japan | 156/621 |
| 3-126662 | 5/1991 | Japan . | |

OTHER PUBLICATIONS

"Magnetic Properties of Materials", Edited by Jan Smit, vol. 13, 1971, pp. 86–89.
"Soft Ferrite Materials", Maruzen Corporation, 1986, p. 80.
Derwent Accession, No. 90–093 998, Questel Telesystems (WPIL), Derwent Publications Ltd., London & JP–A–02–044 099 (Hitachi Metal KK).
Derwent Accession, No. 87–316 426, Questel Telesystems (WPIL), Derwent Publications Ltd., London & JP–A–62–223 099 (NGK Insulators KK).

*Primary Examiner*—Margaret W. Glass
*Attorney, Agent, or Firm*—Parkhurst, Wendel & Burr, L.L.P.

[57] ABSTRACT

A non-magnetic single crystal of Mn—Zn ferrite obtained by a solid phase reaction process including the steps of contacting a seed single crystal ferrite with a polycrystal ferrite and producing the single crystal by growing the single crystal in a direction from the seed single crystal toward the polycrystal under heating. The single crystal of Mn—Zn ferrite has a composition defined by points A, B, C, D and E in a three-phase diagram of $Fe_2O_3$—MnO—ZnO, in which:

A: $Fe_2O_3$ 40 mol %, MnO 10 mol %, ZnO 50 mol %;
B: $Fe_2O_3$ 40 mol %, MnO 35 mol %, ZnO 25 mol %;
C: $Fe_2O_3$ 70 mol %, MnO 5 mol %, ZnO 25 mol %;
D: $Fe_2O_3$ 70 mol %, MnO 2 mol %, ZnO 28 mol %; and
E: $Fe_2O_3$ 48 mol %, MnO 2 mol %, ZnO 50 mol %.

2 Claims, 6 Drawing Sheets

FIG_1

FIG_6

FIG_7

FIG. 8

NON-MAGNETIC SINGLE CRYSTAL MN—ZN FERRITE FOR FLOATING TYPE MAGNETIC HEADS

This is a Continuation of application Ser. No. 08/149,231 filed Nov. 9, 1993, now abandoned.

BACKGROUND OF THE INVENTION

(1) Field of the Invention

The present invention relates to non-magnetic single crystal Mn—Zn ferrite which is produced by a solid phase reaction and can be suitably used for sliders in floating type magnetic heads.

(2) Related Art Statement

Figure 6:
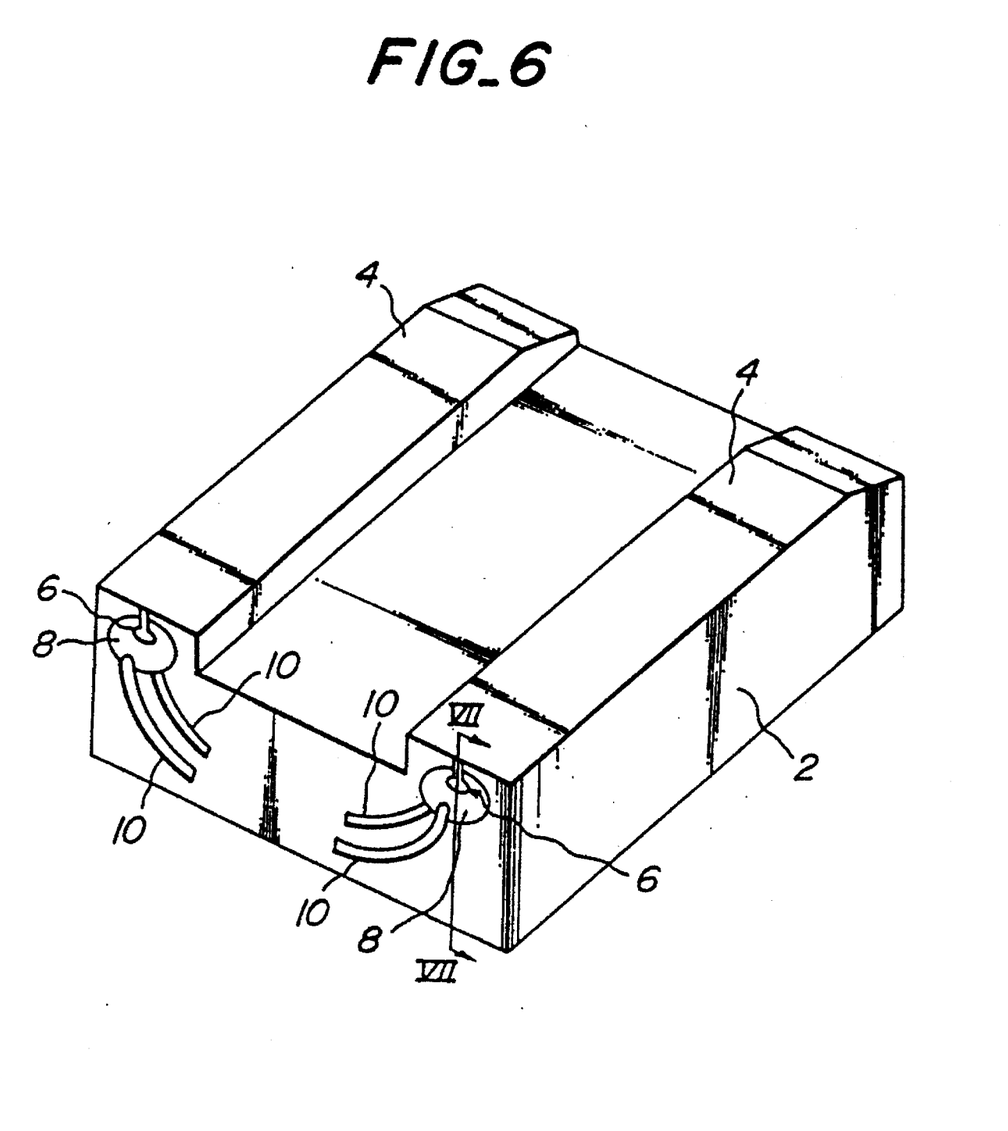
FIG. 6 is a perspective view for schematically illustrating an example of the conventional floating type thin film magnetic head.
Figure 7:
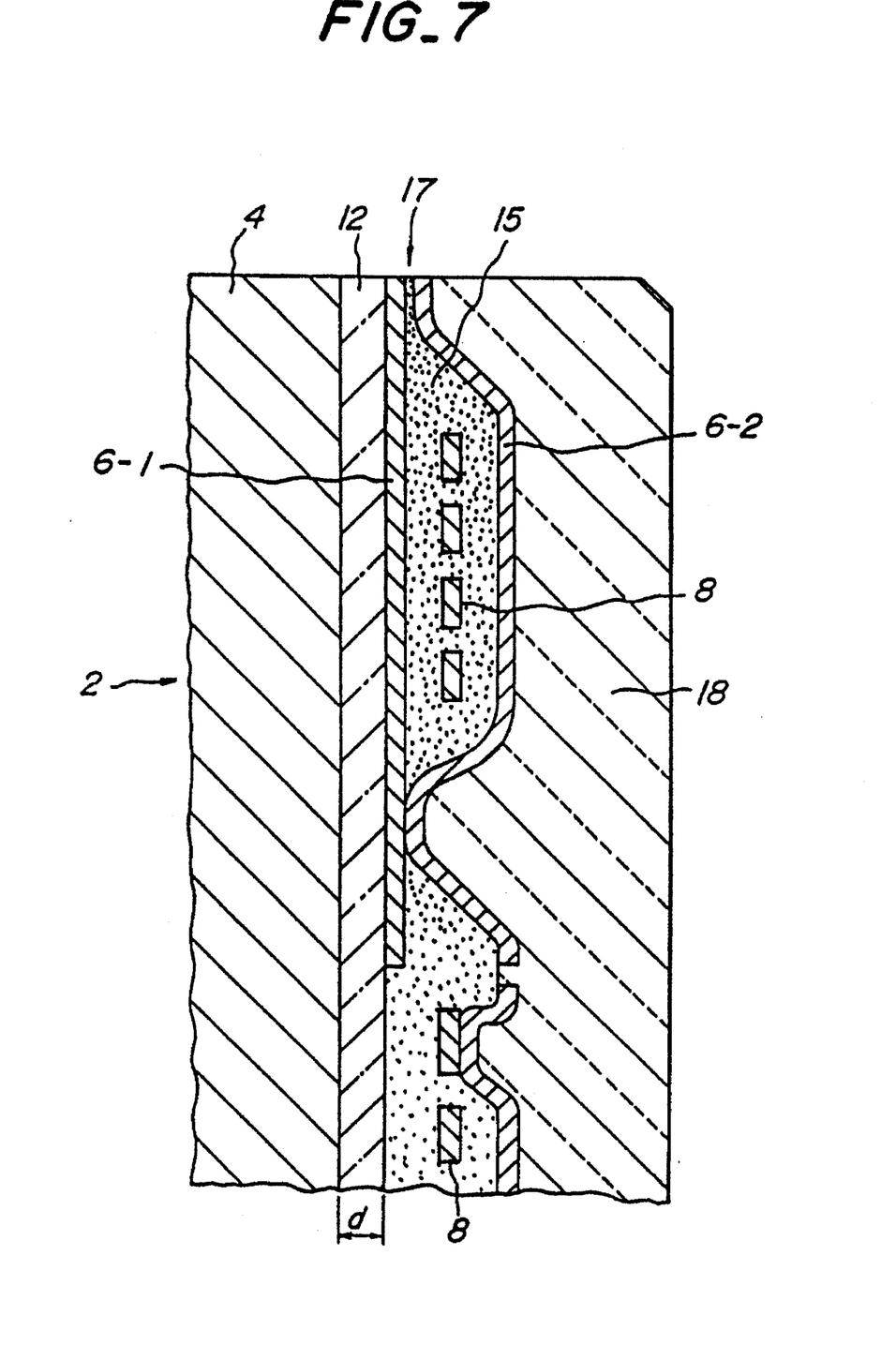
FIG. 7 is a sectional view of a principal portion of the conventional floating type thin film magnetic head in FIG. 6.
Figure 8:
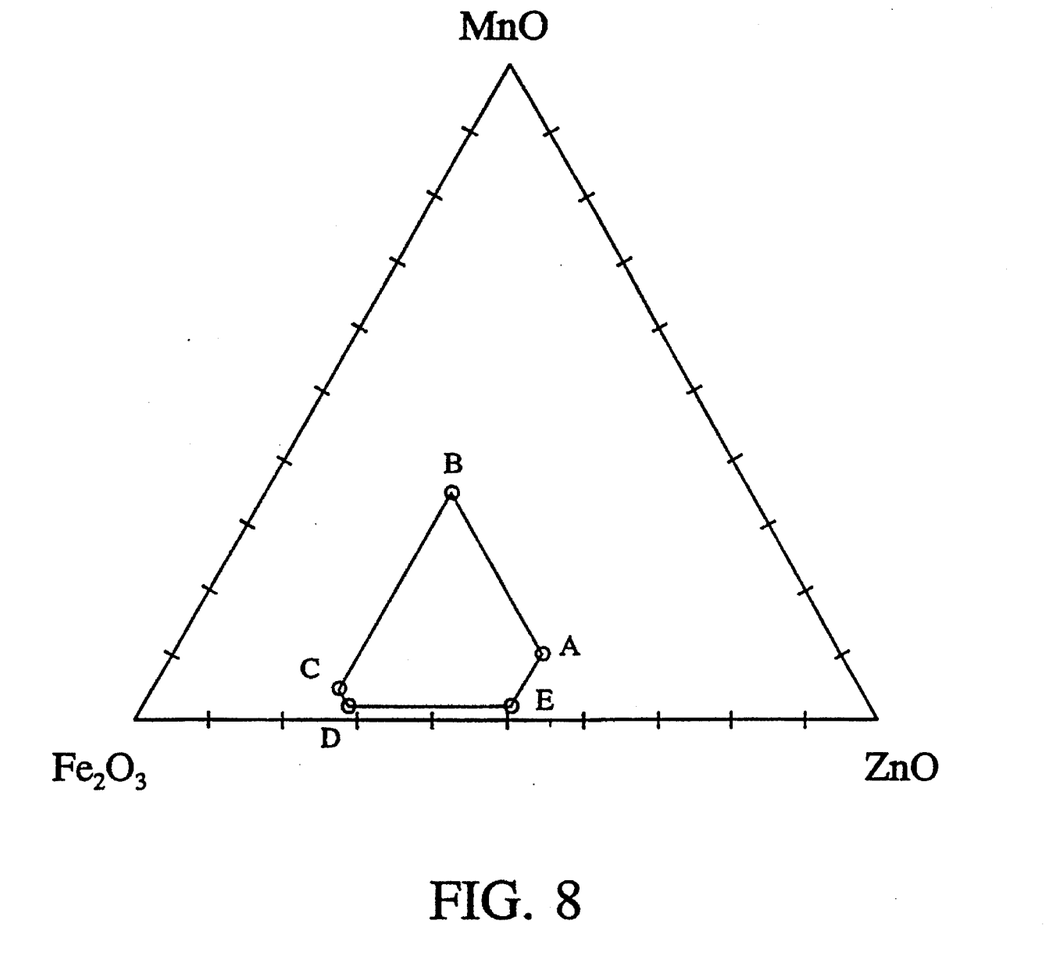
FIG. 8 is a three-phase diagram of $Fe_2O_3$—MnO—ZnO showing the composition of the single crystal ferrite according to the present invention.

Magnetic heads have been formerly used in stationary magnetic disc devices (RDD), and a variety of magnetic heads are known. FIG. 6 schematically shows a floating type thin film magnetic head as an example thereof in which a thin film magnetic head is formed on an end face of each of air bearing portions (A surface protective film is removed from the magnetic head in FIG. 6). In FIG. 6, a slider body 2 has a pair of parallel rail-shaped air bearing portions 4, 4 having a given width at a face where the slider body 2 contacts a magnetically recording medium. The thin film magnetic head is provided on that end face of each of the air bearing portions 4 located on a trailing side thereof (on a rear side as viewed in a slide-contacting direction). The thin film magnetic head is constituted by thin film lower and upper magnetic poles and a thin film-shaped coil 8 arranged between front and rear magnetic poles. The upper magnetic pole only is shown in FIG. 1 by a reference numeral 6. Given current is passed through the coil 8 through leads 10, 10. FIG. 7 is a sectional view for illustrating in detail a principle portion of the floating type thin film magnetic head taken along a line VII—VII in FIG. 6. In FIG. 7, a layer 12 of a non-magnetic material 12 (not shown in FIG. 6) is provided on the trailing side of the slider body 2 made of a ferrite, and a lower magnetic pole 6-1 is provided on the non-magnetic material layer 12. An upper magnetic pole 6-2 is provided above the lower magnetic pole 6-1 through an insulating resist 15. The coil 8 is buried in the insulating resist. A magnetic gap 17 is defined between the upper and lower magnetic poles 6-1 and 6-2. A protective film 18 (not shown in FIG. 6) is provided to protect the upper magnetic pole 6-2. The upper face of the slider body 4 is the air bearing portion 2.

When a magnetic material is used as a material for the slider body 2 for the above-mentioned magnetic head, an insulating layer ordinarily needs to be formed between the slider body and the lower magnetic pole. The magnetic poles of the slider for the magnetic head are formed by plating in a magnetic field, and uniaxial magnetic anisotropy needs to be imparted upon the thus formed magnetic film from the standpoint of performance of the head. Therefore, when a substrate having magnetic property is employed for the slider body, it is difficult to impart such a uniaxial magnetic anisotropy upon the slider body. Therefore, non-magnetic $Al_2O_3$—TiC, non-magnetic $CaTiO_3$ or non-magnetic, polycrystal Zn ferrite is ordinarily used. However, $Al_2O_3$—TiC has poor sliding property between the magnetic disc, and is apt to damage the magnetic disc. On the other hand, since $CaTiO_3$ has a large coefficient of friction relative to the magnetic disc, the slider body is apt to damage the magnetic disc through contact with the disc and in turn the slider itself is likely to be damaged. Further, when a special shape such as a bridging structure in a negative pressure type slider or a shape trail structure is employed as a pair of the bearing portions 4, 4 of the slider body 2, such structures must be usually realized by an ion etching process. Consequently, a producing apparatus is costy. Furthermore, since the etching speed is low, it exerts a large influence upon the cost of production.

In order to solve the above-mentioned problems, Japanese patent application Laid-open No. 3-126,662 discloses an example in which a non-magnetic, polycrystal Mn—Zn ferrite is used as a slider for a magnetic head. However, as mentioned above, if air bearing portions are employed, mechanical working steps become troublesome, and take a long time period. Further, orientations of crystals are not uniform in this MN—Zn ferrite. Therefore, when the air bearing portions are formed by chemically etching the non-magnetic, polycrystal Mn—Zn ferrite, the etching speed differs depending upon crystal grains and accordingly workability of the ferrite in a straight shape becomes deteriorated. As a result, adverse effects appear upon the dimensional stability and the floating performance of the magnetic head.

Furthermore, Japanese patent application Laid-open No. 4-53,013 discloses an example in which a non-magnetic, single crystal ferrite obtained by a so-called Bridgemann process for the production of the single crystal ferrite from a melt is used as a substrate for a magnetic head in a VTR. However, segregation of the composition cannot be avoided in this process. Therefore, when air bearing portions are formed by chemical etching, the etching speed varies. Consequently, good dimensional stability is difficult to realize, and this process cannot be employed for industrial production. Further, if a non-mangentic, single crystal Zn ferrite containing $TiO_2$ is used as a slider for an RDD, a chemically etching speed is small compared with the case of the single crystal Mn—Zn ferrite. Consequently, it is extremely difficult to form air bearing portions from this Zn ferrite, with the result that the slider body of such a single crystal Zn ferrite cannot be produced.

SUMMARY OF THE INVENTION

It is an object of the present invention to solve the above-mentioned problems, and to provide non-magnetic, single crystal Mn—Zn ferrite which has good processability and mass productivity and can be favorably used as a slider for a floating type magnetic head.

The non-magnetic single crystal made of Mn—Zn ferrite according to the present invention is obtained by a process (a solid phase reaction process) including the steps of contacting a seed single crystal ferrite with a polycrystal ferrite and growing the single crystal in a direction from the seed single crystal into the polycrystal ferrite under heating. The thus produced Mn—Zn ferrite single crystal has a composition defined by points A, B, C, D and E in a three-phase diagram of $Fe_2O_3$—MnO—ZnO, in which:

A: $Fe_2O_3$ 40 mol %, MnO 10 mol %, ZnO 50 mol %;
B: $Fe_2O_3$ 40 mol %, MnO 35 mol %, ZnO 25 mol %;
C: $Fe_2O_3$ 70 mol %, MnO 5 mol %, ZnO 25 mol %;
D: $Fe_2O_3$ 70 mol %, MnO 2 mol %, ZnO 28 mol %; and
E: $Fe_2O_3$ 48 mol %, MnO 2 mol %, ZnO 50 mol %.

The non-magnetic, single crystal Mn—Zn ferrite according to the present invention preferably has a composition defined by points A', B', C', D' and E in a three-phase diagram of $Fe_2O_3$—MnO—ZnO, in which:

A': $Fe_2O_3$ 44 mol %, MnO 6 mol %, ZnO 50 mol %;
B': $Fe_2O_3$ 44 mol %, MnO 31 mol %, ZnO 25 mol %;

C': $Fe_2O_3$ 60 mol %, MnO 15 mol %, ZnO 25 mol %;

D': $Fe_2O_3$ 60 mol %, MnO 2 mol %, ZnO 38 mol %; and

E: $Fe_2O_3$ 48 mol %, MnO 2 mol %, ZnO 50 mol %.

In the above non-magnetic, single crystal Mn—Zn ferrite according to the present invention, the porosity of the ferrite is preferably not more than 0.005%.

In the above construction, the non-magnetic, single crystal Mn—Zn ferrite obtained by the solid phase reaction process has good processability. Particularly when such a single crystal ferrite is used as a slider for a magnetic head, an insulating layer between a lower magnetic pole and the slider body can be simplified because the single crystal ferrite is non-magnetic. Further, since the ferrite is the single crystal, a processability such as mechanical processability and chemical etching is good, so that air bearings having a complicated structure can be easily mass produced, and dimensional accuracy and reliability on floating performance are enhanced. Furthermore, when the porosity of the non-magnetic, single crystal Mn—Zn ferrite is set at not more than 0.005 %, breakage of the ferrite due to processing or working can be reduced. Further, since the porosity of the substrate is small (surface property is good), when the ferrite is used as a substrate for a thin film magnetic head and a filmy magnetic pole is directly formed on the substrate, good performance of the magnetic film can be attained (orientation of crystals in the film is good). Moreover, since the surface property of the substrate is good on patterning the magnetic film, the pattern can be formed more accurately in a straight form as desired and straight performance of the truck can be stably realized.

These and other objects, features and advantages of the invention will be appreciated upon reading the following description of the invention when taken in conjunction with the attached drawings, with the understanding that some modifications, variations and changes of the same could be made by the skilled person in the art to which the invention pertains without departing from the spirit of the invention or the scope of claims appended hereto.

BRIEF DESCRIPTION OF THE ATTACHED DRAWINGS

For a better understanding of the invention, reference is made to the attached drawings, wherein.

DETAILED DESCRIPTION OF THE INVENTION

Figure 1:
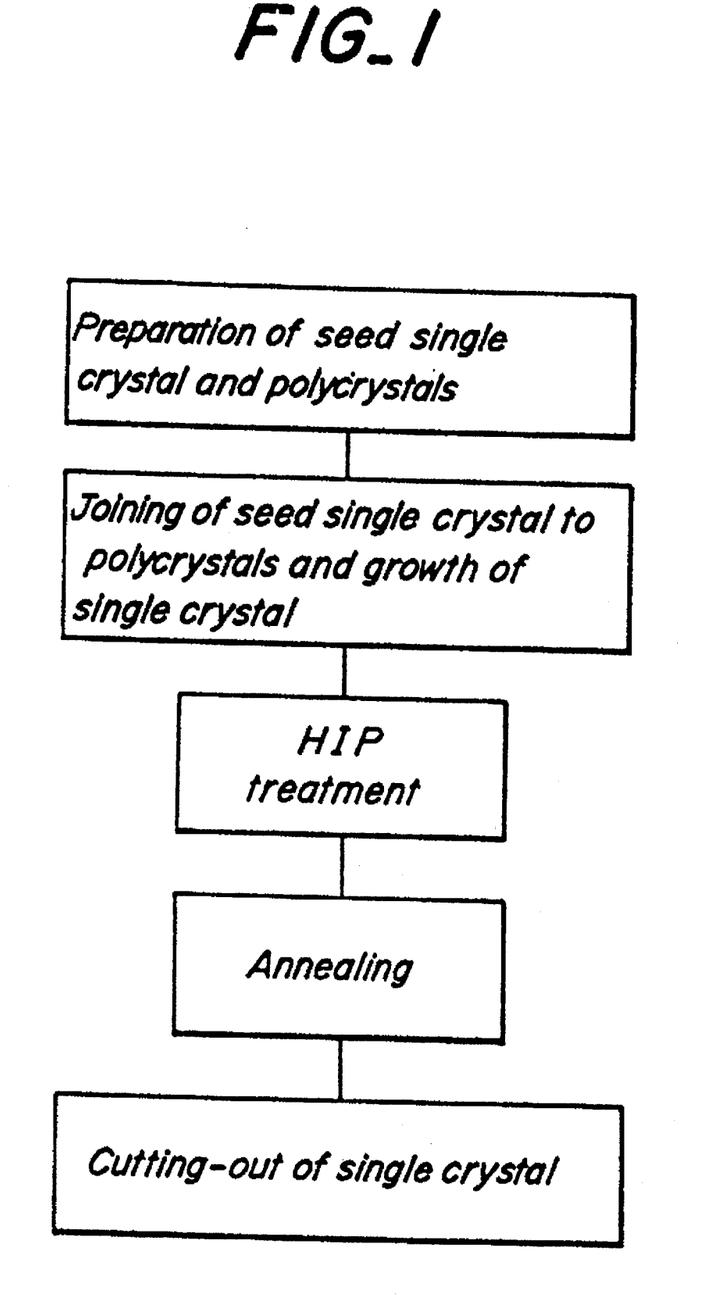
FIG. 1 is a view for illustrating an example of the process for producing non-magnetic, single crystal Mn—Zn ferrite according to the present invention.

FIG. 1 shows a view for illustrating a flow chart of steps of an example of a process for producing the non-magnetic, single crystal Mn—Zn ferrite according to the present invention. The process of the invention being explained with reference to FIG. 1, a single crystal of Mn—Zn ferrite as a seed and a polycrystal Mn—Zn ferrite are prepared to be used in a solid phase reaction. A single crystal is to be grown in this polycrystal. It is preferable that the single crystal Mn—Zn ferrite has the same composition as that of the polycrystal ferrite. However, the single crystal Mn—Zn as the seed for non-magnetic single crystal is not present at the beginning of the solid phase reaction. The molar ratios of $Fe_2O_3$: MnO: ZnO in the seed single crystal may be easily selectively determined by the skilled person in the art in view of an intended composition of the resulting single crystal. More specification, a magnetic single crystal Mn—Zn ferrite having a composition of $Fe_2O_3$: MnO: ZnO=50~57: 20~35: 15~25 may be used as the seed single crystal in the process of the present invention. Further, for example, a magnetic single crystal Mn—Zn ferrite having a composition of $Fe_2O_3$: MnO: ZnO=52.7: 26.6: 20.7 (mol % ratio) may be used as the seed single crystal in the process of the present invention. As the polycrystal Mn—Zn ferrite, non-magnetic, polycrystal Mn—Zn ferrite having an intended composition of the single crystal to be produced is used. The polycrystal Mn—Zn ferrite is preferably obtained by firing according to a firing schedule shown in FIG. 2 by way of example as mentioned later. Although the distance between adjacent lattices slightly differs between the seed single crystal ferrite and the polycrystal ferrite when their compositions differs from each other, a non-magnetic single crystal Mn—Zn ferrite can be grown in the polycrystal Mn—Zn ferrite.

The firing stop in the process of the present invention may be effected as follows by way of example.

The composite body of the seed single crystal and the polycrystal is heated up to a maximum temperature of 1,200°–1,400° C., and kept at this temperature for 4–8 hours to make the fired body including the inner portion uniform, while the firing atmosphere is replaced by oxygen, and being evacuated to vacuum by using a rotary pump in a temperature range from room temperature up to an evacuation terminating temperature of not less than 200° C. but not more than 1,200° C. The firing atmosphere during a temperature-rising step excluding this temperature range is composed of 10–100% of oxygen in view of an equilibrium oxygen concentration and non-magnetizing. On the other hand, during a temperature-descending step, nitrogen atmosphere is employed in a temperature range from the maximum temperature to 1,100° C.–800° C., because when oxygen is present during the temperature-descending step, hematite is precipitated due to oxidation to produce cracks in the sintered body in this temperature range. In order to prevent occurrence of microcracks of a surface portion of the sintered body at temperatures lower than this temperature range, feeding of nitrogen gas is stopped and the atmosphere is sealingly isolated from the exterior atmosphere.

The reasons why the atmosphere is evacuated to vacuum in the temperature range of 200°–1,200° C. are that if no vacuum evacuation is effected at at least 200° C. or more, cracks occur in the sintered body. If vacuum evacuation is effected at more than 1,200° C., conspicuous evaporation of Zn takes place to make the composition of the sintered body non-uniform, and removal of a binder, removal of oxygen and densification must also be considered. The maximum temperature is set in the above temperature range from 1,200°–1,400° C. in view of the elongation of the resulting single crystal particle diameter of around 10 µm in the sintered body. Both the heating and cooling rates are set at 10° C./h to 300° C./h, because the length of the densifying and treating time period must be considered, and when the heating and/or cooling rate is more than 300° C./h, the sintered body is likely to be cracked.

Next, the growing step in the process step of the present invention may be effected as follows.

The fired composite body is heated up to a maximum temperature from 1,500° to 1,550° C., and then kept at this temperature for 0.5–1 hour so as to extinguish sub-grains (a part of polycrystals remaining in the resulting single crystal as crystals having the diameter of around 100 µm during growing the single crystal from the polycrystals). The atmosphere during heating from room temperature to 1,200° C. is constituted by nitrogen, since the hematite phase is precipitated due to oxidation and the mother material is cracked. The concentration of oxygen in the atmosphere at other than this temperature range is set at 5 to 100% in view of the equilibrium concentration of oxygen and non-magnetizing.

The heating rate is set at 5°–300° C./h in a temperature range from 1,300°–1,550° C. at which the polycrystal is converted to an excellent single crystal. Since the mother material is likely to be cracked if the heating rate and/or the cooling rate at temperatures other than this temperature range is more than 300° C./h, the heating and cooling rate at temperatures other than this temperature range is set at 150°–300° C./h.

The HIP treatment of the producing process of the present invention may be effected as follows by way of example.

The composite body is heated to a maximum temperature from 1,100°–1,550° C., and kept at this temperature for 0.5–4 hours, while pressure is kept at 500–2,000 kgf/cm$^2$. The maximum temperature and the pressure are set as above so as to suppress the pore diameter of the resulting single crystal down to not more than 0.05%. Further, the firing time is set as 0.5–4 hours so as to make the firing body including an inner portion uniform.

The heating and cooling rates are set at 150°–900° C./h in view of the treating time and prevention of occurrence of cracks. Since the HIP treatment device generally uses an inert gas, argon or nitrogen is used as the atmosphere.

The annealing step of the process of the present invention may be effected as follows. That is, the composite body is heated up to a maximum temperature from 800°–1,500° C., and is kept at this maximum temperature for 1–8 hours. The maximum temperature of 800°–1,500° C. is effective for decreasing fracture due to working and to remove strain. The maximum-temperature keeping time of 1–8 hours makes the single crystal including the interior portion of the resulting single crystal. The heating and cooling rates are set at 150° C.–300° C./h, because if the heating and/or cooling rate is more than 300° C./h, the resulting single crystal is likely to be cracked.

The atmosphere during a portion of the temperature rising step lying in a temperature range of room temperature to 1,200° C. is constituted by nitrogen, because if oxygen exists, the hematite phase is precipitated due to oxidation to cause cracks in the resulting single crystal. Then, the atmosphere during the remaining portion of the temperature-rising step is adjusted to have the concentration of oxygen of 5–100% in view of the equilibrium oxygen concentration.

On the other hand, in order to prevent oxidation, the atmosphere is constituted by nitrogen during the temperature-descending step from the maximum temperature to room temperature.

In FIGS. 2 through 5 are shown a firing schedule, a growing schedule, a HIP schedule and an annealing schedule.

Figure 2:
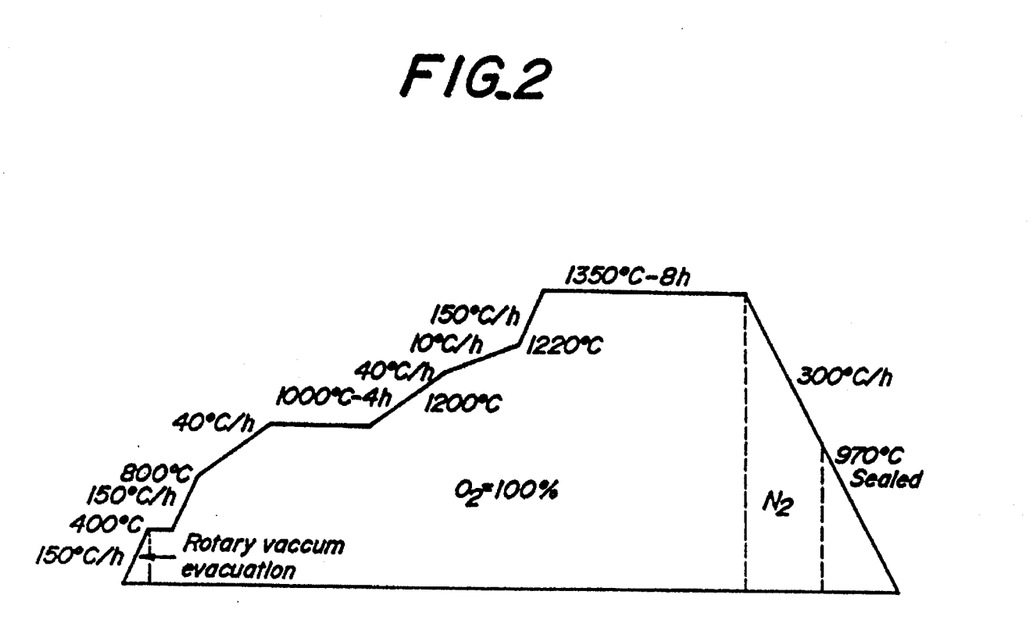
FIG. 2 is a view for illustrating an example of a firing schedule in the producing process in the present invention.

In the firing schedule of FIG. 2, the Mn—Zn ferrite is heated from room temperature to 400° C. at a heating rate of 150° C./h, while atmosphere is evacuated to vacuum by a rotary pump. Then, after the atmosphere is replaced by $O_2$ (100%) and the temperature is kept 400° C. for 0.5 hour, the material is heated up to 800° C. at a heating rate of 150° C./h and then up to 1,000° C. at a heating rate of 40° C./h. Next, after the temperature is kept at 1,000° C. for 4 hours, the temperature is raised to 1,200° C. at a heating rate of 40° C./h and then up to 1,220° C. for 10° C./h, and finally up to 1,350° C. at a heating rate of 150° C./h. Then, after the temperature is kept at 1,350° C. for 8 hours, the atmosphere is replaced by $N_2$ and the material is cooled at a cooling rate of 300° C./h. At 970° C., the feeding of $N_2$ gas is stopped, and the atmosphere is sealingly isolated from the exterior so that an equilibrium oxygen concentration may be kept to obtain a sintered body containing a low level of cracks.

Figure 3:
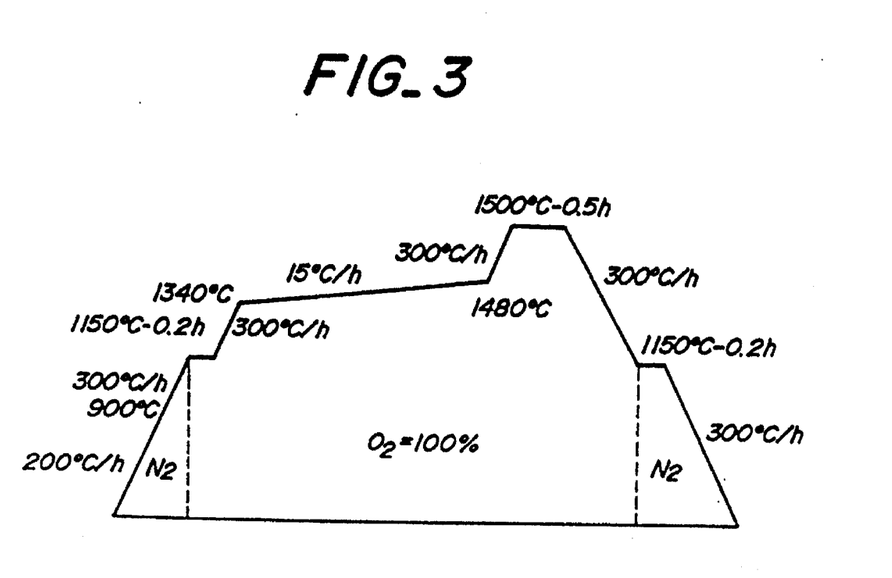
FIG. 3 is a view for illustrating an example of a single crystal-growing schedule in the producing process of the present invention.

The single crystal Mn—Zn ferrite and the polycrystal Mn—Zn ferrite prepared above are joined together, and a solid phase reaction is effected according to a single crystal-growing schedule shown in FIG. 3 by way of example. Thereby, a non-magnetic, single crystal Mn—Zn ferrite is grown in the polycrystal Mn—Zn ferrite. In the single crystal-growing schedule of FIG. 3, heating is effected from room temperature to 1,150° C. at a heating rate of 300° C./h after the atmosphere is replaced by $N_2$. After $N_2$ in the atmosphere is completely replaced by $O_2$ (100%), the temperature is kept at 1,150° C. for 0.2 hours. Then, the temperature is raised to 1,340° C. at a heating rate of 300° C. and then up to 1,480° C. at a heating rate of 15° C./h, and up to 1,500° C. at a heating rate of 300° C. Next, the temperature is kept at 1,500° C. for 0.5 hours, cooling is effected down to 1,150° C. at a cooling rate of 300° C./h. After the atmosphere is replaced by $N_2$, the temperature is kept at 1,150° C. for 0.2 hours, and cooling is effected down to room temperature at a cooling rate of 300° C./h.

Figure 4:
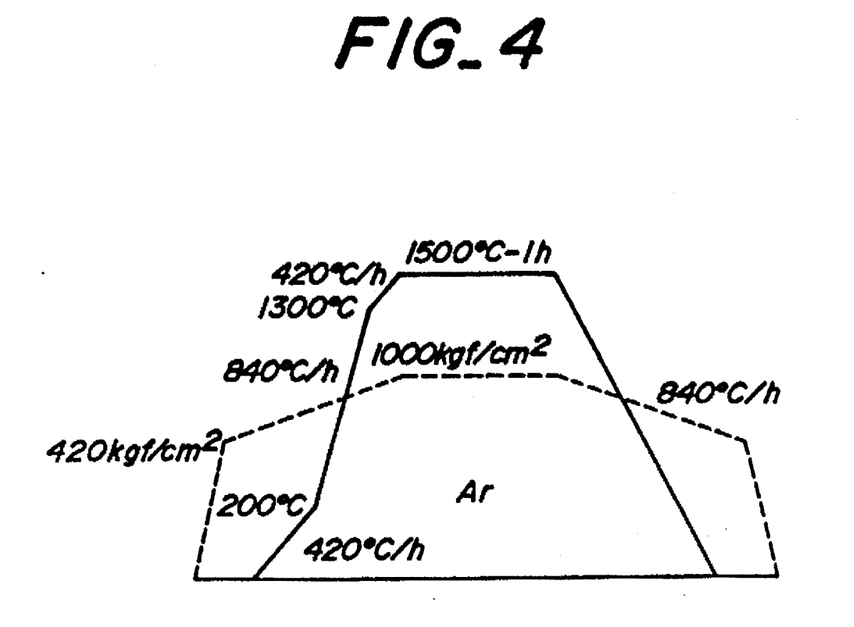
FIG. 4 is a view for illustrating an example of a HIP treating schedule in the producing process of the present invention.

Then, after the single crystal is grown into the polycrystal, the joined body is subjected to an HIP treatment schedule shown in FIG. 4 in an Ar atmosphere by way of example. That is, the joined body is heated from room temperature to 200° C. at a heating rate of 420° C./h, up to 1,300° C. at a heating rate of 840° C./h, and up to 1,500° C. at a heating rate of 420° C./h. Next, after the temperature is kept at 1,500° C. for 1 hour, the joined body is cooled to room temperature at a cooling rate of 840° C./h. The pressure is varied during the HIP treatment schedule as shown in FIG. 4 from the atmospheric pressure, 420 kgf/cm$^2$, 1,000 kgf/cm$^2$ to 420 kgf/cm$^2$.

Figure 5:
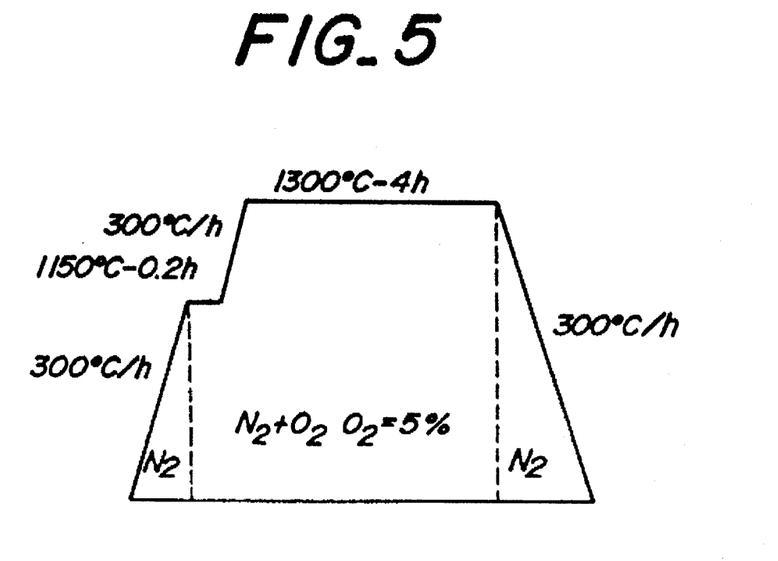
FIG. 5 is a view for illustrating an example of a annealing schedule in the producing process of the present invention.

After the HIP treatment, the joined body is annealed according to a schedule shown in FIG. 5 by way of example, and the thus grown single crystal ferrite is cut out from the joined body, thereby obtaining a non-magnetic, single crystal Mn—Zn ferrite in accordance with the present invention. In the annealing in FIG. 5, the joined body is heated from room temperature to 1,150° C. at a heating rate of 300° C./h after the atmosphere is replaced by $N_2$. Then, after the atmosphere is replaced by $N_2+O_2$ ($O_2=5\%$), the temperature is kept at 1,150° C. for 0.2 hours, and is then raised to 1,300° C. at a heating rate of 300° C./h. Thereafter, the temperature is kept at 1,300° C. for 4 hours. Finally, after the atmosphere is replaced by $N_2$, the joined body is cooled to room temperature at a cooling rate of 300° C.

In the following, examples of the present invention will be explained.

Experiment 1

According to the above-mentioned producing process, a single crystal Mn—Zn ferrite was grown from a polycrystal Mn—Zn ferrite having a composition shown in the following Tables 1 or 2. The single crystal ferrite had the same composition as that of the polycrystal ferrite. The shape of the polycrystal ferrite as a mother material was 17×8×5 thick (mm). With respect to each of Mn—Zn ferrite single crystals having various compositions falling inside or outside the range of the present invention, elongation was measured, and Curie temperature was also measured for the judgment as to whether the single crystal was magnetic or non-magnetic. At that time, the porosity of the single crystal immediately after growing through the solid phase reaction was measured, and the porosity of the single crystal was also measured after the HIP treatment and the annealing. Results are shown in Tables 1 and 2.

TABLE 1

| Sample | Composition (mol %) | | | Elongation of single crystal Max. 10 mm (mm) | Curie Temperature (°C.) | Porosity of single crystal (%) | Porosity of single crystal after HIP and annealing (%) |
|---|---|---|---|---|---|---|---|
| | $Fe_2O_3$ | MnO | ZnO | | | | |
| Invention Examples | 40.0 | 10.0 | 50.0 | 4.0 | ≦−50 | 0.0110 | 0.0048 |
| | 40.0 | 14.0 | 46.0 | 4.1 | ≦−50 | 0.0120 | 0.0050 |
| | 40.0 | 22.0 | 38.0 | 4.3 | ≦−50 | 0.0110 | 0.0047 |
| | 40.0 | 30.0 | 30.0 | 4.2 | −15 | 0.0120 | 0.0050 |
| | 40.0 | 35.0 | 25.0 | 4.2 | −12 | 0.0120 | 0.0050 |
| | 44.0 | 6.0 | 50.0 | 8.0 | ≦−50 | 0.0100 | 0.0010 |
| | 44.0 | 10.0 | 46.0 | 8.2 | ≦−50 | 0.0100 | 0.0010 |
| | 44.0 | 18.0 | 38.0 | 8.4 | ≦−50 | 0.0095 | 0.0012 |
| | 44.0 | 26.0 | 30.0 | 8.4 | −11 | 0.0100 | 0.0010 |
| | 44.0 | 31.0 | 25.0 | 8.5 | −8 | 0.0110 | 0.0013 |
| | 45.0 | 5.0 | 50.0 | 8.1 | ≦−50 | 0.0095 | 0.0012 |
| | 45.0 | 9.0 | 46.0 | 8.3 | ≦−50 | 0.0095 | 0.0010 |
| | 45.0 | 17.0 | 38.0 | 8.5 | ≦−50 | 0.0110 | 0.0010 |
| | 45.0 | 25.0 | 30.0 | 8.6 | −10 | 0.0095 | 0.0010 |
| | 45.0 | 30.0 | 25.0 | 8.7 | −9 | 0.0110 | 0.0012 |
| | 48.0 | 2.0 | 50.0 | 8.0 | ≦−50 | 0.0090 | 0.0010 |
| | 48.0 | 6.0 | 46.0 | 8.4 | ≦−50 | 0.0095 | 0.0009 |
| | 48.0 | 14.0 | 38.0 | 10.0 | ≦−50 | 0.0095 | 0.0010 |
| | 48.0 | 22.0 | 30.0 | 10.0 | −9 | 0.0100 | 0.0010 |
| | 48.0 | 27.0 | 25.0 | 10.0 | −5 | 0.0095 | 0.0009 |
| | 50.0 | 2.0 | 48.0 | 8.1 | ≦−50 | 0.0090 | 0.0010 |
| | 50.0 | 4.0 | 46.0 | 8.5 | ≦−50 | 0.0090 | 0.0009 |
| | 50.0 | 12.0 | 38.0 | 10.0 | ≦−50 | 0.0090 | 0.0010 |
| | 50.0 | 20.0 | 30.0 | 10.0 | −8 | 0.0095 | 0.0011 |
| | 50.0 | 25.0 | 25.0 | 10.0 | −4 | 0.0090 | 0.0010 |
| | 55.0 | 2.0 | 43.0 | 8.7 | ≦−50 | 0.0085 | 0.0010 |
| | 55.0 | 7.0 | 38.0 | 10.0 | ≦−50 | 0.0095 | 0.0010 |
| | 55.0 | 15.0 | 30.0 | 10.0 | −4 | 0.0095 | 0.0011 |
| | 55.0 | 20.0 | 25.0 | 10.0 | −2 | 0.0095 | 0.0009 |
| | 60.0 | 2.0 | 38.0 | 8.5 | ≦−50 | 0.0090 | 0.0011 |
| | 60.0 | 10.0 | 30.0 | 10.0 | −2 | 0.0095 | 0.0010 |
| | 60.0 | 15.0 | 25.0 | 10.0 | −1 | 0.0100 | 0.0010 |
| | 65.0 | 2.0 | 33.0 | 6.2 | 0 | 0.0095 | 0.0030 |
| | 65.0 | 5.0 | 30.0 | 6.3 | 8 | 0.0095 | 0.0029 |
| | 65.0 | 10.0 | 25.0 | 6.7 | 10 | 0.0100 | 0.0030 |
| | 70.0 | 2.0 | 28.0 | 4.5 | 11 | 0.0095 | 0.0049 |
| | 70.0 | 5.0 | 25.0 | 4.5 | 13 | 0.0100 | 0.0050 |

TABLE 2

| Sample | Composition (mol %) | | | Elongation of single crystal Max. 10 mm (mm) | Curie Temperature (°C.) | Porosity of single crystal (%) | Porosity of single crystal after HIP and annealing (%) |
|---|---|---|---|---|---|---|---|
| | $Fe_2O_3$ | MnO | ZnO | | | | |
| Comparative Examples | 30.0 | 18.0 | 52.0 | 0 | ≦−50 | — | — |
| | 30.0 | 24.0 | 46.0 | 0 | ≦−50 | — | — |
| | 30.0 | 40.0 | 30.0 | 0 | ≦−50 | — | — |
| | 30.0 | 50.0 | 20.0 | 0 | 51 | — | — |
| | 35.0 | 13.0 | 52.0 | 0 | ≦−50 | — | — |
| | 35.0 | 19.0 | 46.0 | 0 | ≦−50 | — | — |
| | 35.0 | 27.0 | 38.0 | 0 | ≦−50 | — | — |

TABLE 2-continued

| Sample | Composition (mol %) | | | Elongation of single crystal Max. 10 mm (mm) | Curie Temperature (°C.) | Porosity of single crystal (%) | Porosity of single crystal after HIP and annealing (%) |
|---|---|---|---|---|---|---|---|
| | $Fe_2O_3$ | MnO | ZnO | | | | |
| | 35.0 | 35.0 | 30.0 | 0 | −30 | — | — |
| | 35.0 | 45.0 | 20.0 | 0 | 56 | — | — |
| | 40.0 | 8.0 | 52.0 | 0.5 | ≦−50 | 0.0110 | 0.0050 |
| | 40.0 | 40.0 | 20.0 | 5.0 | 61 | 0.0110 | 0.0048 |
| | 44.0 | 4.0 | 52.0 | 0.5 | ≦−50 | 0.0110 | 0.0013 |
| | 44.0 | 36.0 | 20.0 | 8.6 | 75 | 0.0120 | 0.0013 |
| | 45.0 | 3.0 | 52.0 | 0.6 | ≦−50 | 0.0090 | 0.0011 |
| | 45.0 | 35.0 | 20.0 | 8.8 | 80 | 0.0100 | 0.0011 |
| | 48.0 | 0.0 | 52.0 | 0.6 | ≦−50 | 0.0095 | 0.0011 |
| | 48.0 | 32.0 | 20.0 | 10.0 | 90 | 0.0095 | 0.0011 |
| | 50.0 | 0.0 | 50.0 | 2.0 | ≦−50 | 0.0110 | 0.0012 |
| | 50.0 | 30.0 | 20.0 | 10.0 | 100 | 0.0095 | 0.0013 |
| | 55.0 | 0.0 | 45.0 | 1.5 | ≦−50 | 0.0085 | 0.0008 |
| | 55.0 | 25.0 | 20.0 | 10.0 | 120 | 0.0095 | 0.0012 |
| | 60.0 | 0.0 | 40.0 | 1.5 | ≦−50 | 0.0100 | 0.0012 |
| | 60.0 | 20.0 | 20.0 | 10.0 | 140 | 0.0095 | 0.0009 |
| | 65.0 | 0.0 | 35.0 | 1.0 | −10 | 0.0100 | 0.0031 |
| | 65.0 | 15.0 | 20.0 | 6.5 | 160 | 0.0100 | 0.0029 |
| | 70.0 | 0.0 | 30.0 | 0.5 | 10 | 0.0120 | 0.0052 |
| | 70.0 | 10.0 | 20.0 | 5.0 | 170 | 0.0110 | 0.0051 |
| | 75.0 | 0.0 | 25.0 | 0.5 | 50 | 0.0120 | 0.0055 |
| | 75.0 | 2.0 | 23.0 | 2.0 | 90 | 0.0130 | 0.0056 |
| | 75.0 | 5.0 | 20.0 | 2.5 | 180 | 0.0110 | 0.0054 |

It is seen from the results in Tables 1 and 2 that the composition exhibiting the Curie temperature being less than room temperature (25° C.), i.e., the composition exhibiting the non-magnetic property at more than room temperature is $Fe_2O_3$: no more than 70 mol % and ZnO: no less than 25 mol %. Further, it is preferable that the Curie temperature is less than 0° C. and the single crystal exhibits non-magnetic property at more than 0° C. For this purpose, it is seen that the composition is $Fe_2O_3$: no more than 60 mol % and no less than 25 mol %. When the single crystal is used as a slider for a floating type magnetic head slider, the elongation needs to be not less than 4 mm from the standpoint of the shape. The elongation is a distance of the single crystal measured from boundary between the seed single crystal and the polycrystal (mother material) by using a scale. The composition exhibiting the elongation of not less than 4 mm is $Fe_2O_3$:40–70 mol %, MnO: 2–35 mol %, and ZnO: 25–50 mol %. The composition exhibiting the elongation of not less than 8 mm is $Fe_2O_3$:40–60 mol %, MnO: 231 mol %, and ZnO: 25–50 mol %.

Experiment 2

In order to examine chemically etched performance, each of single crystal ferrites having a composition falling inside or outside the range of the present invention shown in Table 3 was prepared by the solid phase reaction process according to the above-mentioned producing process. Then, after the single crystal was masked to give an air bearing, the single crystal was immersed into an aqueous solution of phosphoric acid (containing 85 wt % of $H_3PO_4$) at 80° C. for 1 hour. A step formed was measured by a surface roughness meter, and workability in a straight form was observed by a microscope. Results are shown in Table 3.

TABLE 3

| Sample | Composition (mol %) | | | Magnetic property | Step (μm) | Workability in straight shape |
|---|---|---|---|---|---|---|
| | $Fe_2O_3$ | MnO | ZnO | | | |
| Invention Example A | 55.0 | 2.7 | 43.0 | non-magnetic | 21 | good |
| Invention Example B | 55.0 | 7.0 | 38.0 | non-magnetic | 23 | good |
| Invention Example C | 55.0 | 15.0 | 30.0 | non-magnetic | 26 | good |
| Invention Example D | 55.0 | 20.0 | 25.0 | non-magnetic | 28 | good |
| Conventional Example | 55.0 | 25.0 | 20.0 | magnetic | 30 | good |

It is seen from the results in Table 3 that the non-magnetic Mn—Zn ferrite single crystals falling in the scope of the present invention exhibited good workability in the straight shape as is the same with the conventional magnetic material, and sufficient step can be produced.

As is clear from the above-mentioned explanation, according to the present invention, the non-magnetic, single crystal Mn—Zn ferrite can be obtained, which can be favorably used as the substrate for the thin film magnetic heads. Therefore, for example, when the non-magnetic Mn—Zn ferrite single crystal according to the present invention is used as the slider for the magnetic head, the insulating layer between the lower magnetic pole and the slider body can be simplified. Further, since the single crystal according to the present invention exhibits good mechanical workability and chemical etching performance, the air bearings having complicated shapes can be mass produced, and dimensional accuracy and reliability in the floating performance can be enhanced. In addition, when the non-magnetic Mn—Zn ferrite single crystal according to the present invention is used in place of $CaTiO_2$ which has been conventionally used as the slider in the composite type head, the slider having good sliding performance can be obtained. Furthermore, when the porosity of the single crystal is not more than 0.005, an amount of a portion of the single crystal broken due to working is small. Moreover, when the single crystal according to the present invention is used as the substrate for the thin film magnetic head, the straight form of the track can be stably realized.

What is claimed is:

1. A non-magnetic single crystal of Mn—Zn ferrite obtained by a solid phase reaction process including the steps of contacting a seed single crystal ferrite with a polycrystal crystal ferrite and producing the non-magnetic single crystal by growing the single crystal in a direction from the seed single crystal toward the polycrystal crystal under heating, said single crystal of Mn—Zn ferrite having a porosity of not more than 0.005%, a Curie point not higher than −50° C. and a composition defined by points A, B, C and D in a three-phase diagram of $Fe_2O_3$—MnO—ZnO, in which:

A: $Fe_2O_3$ 40 mol %, MnO 10 mol%, ZnO 50 mol %;
B: $Fe_2O_3$ 40 mol %, MnO 22 mol %, ZnO 38 mol %;
C: $Fe_2O_3$ 60 mol %, MnO 2 mol%, ZnO 38 mol %; and
D: $Fe_2O_3$ 48 mol %, MnO 2 mol %, ZnO 50 mol %.

2. A magnetic head assembly comprising:

a slider body comprising a non-magnetic single crystal of Mn—Zn ferrite obtained by a solid phase reaction process including the steps of contacting a seed single crystal ferrite with a polycrystal crystal ferrite and producing the non-magnetic single crystal by growing the single crystal in a direction from the seed single crystal toward the polycrystal crystal under heating, said single crystal of Mn—Zn ferrite having a porosity of not more than 0.005%, a Curie point not higher than −50° C. and a composition defined by points A, B, C and D in a three-phase diagram of $Fe_2O_3$—MnO—ZnO, in which:

A: $Fe_2O_3$ 40 mol %, MnO 10 mol %, ZnO 50 mol %;
B: $Fe_2O_3$ 40 mol %, MnO 22 mol %, ZnO 38 mol %;
C: $Fe_2O_3$ 60 mol %, MnO 2 mol %, ZnO 38 mol %;
D: $Fe_2O_3$ 48 mol %, MnO 2 mol %, ZnO 50 mol %; and at least one magnetic head formed on one end of said slider body.

* * * * *